United States Patent
Goh et al.

(10) Patent No.: US 12,313,650 B2
(45) Date of Patent: May 27, 2025

(54) MULTI-BEAM CANTILEVER STYLE CONTACT PIN FOR IC TESTING

(71) Applicant: EQUIPTEST ENGINEERING PTE LTD, Singapore (SG)

(72) Inventors: Michael Goh, Singapore (SG); Chwee Hoe Ong, Singapore (SG); Kean Loon Khor, Singapore (SG)

(73) Assignee: Equiptest Engineering Pte Ltd, Singapore (SG)

( * ) Notice: Subject to any disclaimer, the term of this patent is extended or adjusted under 35 U.S.C. 154(b) by 42 days.

(21) Appl. No.: 18/018,817

(22) PCT Filed: Aug. 5, 2020

(86) PCT No.: PCT/SG2020/050454
§ 371 (c)(1),
(2) Date: Jan. 30, 2023

(87) PCT Pub. No.: WO2022/031219
PCT Pub. Date: Feb. 10, 2022

(65) Prior Publication Data
US 2023/0349949 A1    Nov. 2, 2023

(51) Int. Cl.
*G01R 1/067* (2006.01)
*G01R 1/04* (2006.01)

(52) U.S. Cl.
CPC ....... *G01R 1/06727* (2013.01); *G01R 1/0466* (2013.01); *G01R 1/0458* (2013.01)

(58) Field of Classification Search
CPC . G01R 1/06727; G01R 1/0466; G01R 1/0458
See application file for complete search history.

(56) References Cited

U.S. PATENT DOCUMENTS 5,368,497 A * 11/1994 Nagumo .............. H05K 7/1023
439/331
6,854,981 B2   2/2005 Nelson
(Continued)

FOREIGN PATENT DOCUMENTS

CN   107 807 256 A   3/2018
CN   208520905 U    2/2019
(Continued)

OTHER PUBLICATIONS

Pad Rol® 200 by Johnstech, Johnstech International Corporation, Minneapolis, MN USA, Product specification, https://www.johnstech.com/, Jan. 15, 2015, 2 pages.
(Continued)

*Primary Examiner* — Reena Aurora
(74) *Attorney, Agent, or Firm* — Knobbe, Martens, Olson & Bear, LLP

(57) ABSTRACT

An integral electrical contact pin for electrically connecting a test terminal of tester load board with an IC terminal of an IC device, adapted for short test height. The integral electrical contact pin comprises an upper cantilever arm and lower cantilever arm connected at a back portion. The upper cantilever arm is movable between a first default position to a second and third position, where the upper cantilever arm is in contact with the lower cantilever arm in the second position. A bracket arm is provided, extending in the opposite direction from the two cantilever arms for engagement with the corresponding socket housing.

15 Claims, 5 Drawing Sheets

(56) References Cited

U.S. PATENT DOCUMENTS

| | | | |
|---|---|---|---|
| 9,046,568 B2* | 6/2015 | Ho | G01R 1/067 |
| 10,578,645 B2 | 3/2020 | Foong et al. | |
| 2004/0257100 A1 | 12/2004 | Leong | |
| 2010/0022104 A1* | 1/2010 | Osato | G01R 1/0466 |
| | | | 439/65 |
| 2010/0311285 A1 | 12/2010 | Gschwendtberger | |
| 2014/0127953 A1 | 5/2014 | Foong et al. | |
| 2015/0276808 A1 | 10/2015 | Teranishi et al. | |
| 2017/0219624 A1 | 8/2017 | Foong et al. | |

FOREIGN PATENT DOCUMENTS

| | | | |
|---|---|---|---|
| KR | 10-2010-0012983 A | | 2/2010 |
| KR | 10-2092006 B1 | | 3/2020 |
| KR | 102092006 | * | 3/2020 |
| WO | WO 2012/165936 A1 | | 12/2012 |

OTHER PUBLICATIONS

European Search Report for Application No. 20948587.9 dated Jul. 19, 2024 in 15 pages.

* cited by examiner

MULTI-BEAM CANTILEVER STYLE CONTACT PIN FOR IC TESTING

CROSS-REFERENCE TO RELATED APPLICATIONS

This application claims priority to and is a 371 of international PCT Application No. PCT/SG2020/050454 filed on Aug. 5, 2020, the entire contents of which are hereby incorporated by reference.

FIELD OF INVENTION

The present invention generally relates to test contactors used to establish an electrical interface between an integrated circuit (IC) device under test (DUT), and a circuit board, and more particularly, a cantilever style type contact pin for non-kelvin testing.

BACKGROUND OF THE INVENTION

Testing of IC devices is performed at specific test heights to cater to different types of IC devices. For lower standing wave ratio (SWR) loss and radiation loss between the DUT and load board, test height less than 2 mm are generally desired in high-frequency testing of Bluetooth/GPS/LTE/wireless devices while test heights above 2 mm are commonly used for testing of general analog/digital/mixed signal devices.

The type of contact pin used is influenced by the test height. In particular for test heights at 2 mm and below including 1.40 mm, 0.75 mm and 0.5 mm test heights, due to competing considerations of manufacturing cost of the contact pin versus the mechanical and electrical reliability of the contact pin, contact pin assemblies that include multiple components working in tandem are preferred. Such contact pin solutions are generally known as "short rigid pins", which underlines the fact that these conductive pins are designed not to deform under test conditions.

Examples of such multiple component contact pin solutions are described in U.S. Pat. No. 10,578,645 (Foong et al), U.S. Pat. No. 6,854,981 (Nelson). PAD ROL® 200 by Johnstech is a short rigid contact pin design commercially available in the market.

A number of issues are connected with the use of such short rigid pin and elastomer assemblies. Compared to a single, integral metal body contact pin, the performance of the assembly is dependent on the pin and elastomer working in tandem. Failure or degradation of any one of these components will lead to deterioration of performance. It is known that the elastomer is expected to degrade faster than the conductive metal pin and it is also known that the resilience of elastomers decreases over the period of its degradation.

Depending on the position of the short rigid pin in the socket housing, its design and the rotation that it makes during test condition, repeated impingement of the pin onto the socket housing or the load board can lead to socket housing wear and tear and damage to the load board.

Test sockets that employ short rigid pin and elastomer assemblies are not suitable for extreme temperature testing, for example at −60 degree Celsius or 180 degree Celsius since the elastomer is not expected to perform for long at these temperatures.

It had been observed that short rigid pin and elastomer assemblies have relatively long scrub/wiping length in the range of 0.10 mm to 0.25 mm which results in more dirt generation. Dirt accumulation is problematic as it leads to increase in contact resistance and the need for higher frequency of cleaning. Long scrubbing length is known to cause faster wear and tear on contact pin tip thus reducing lifespan.

Test sockets with short rigid pin and elastomer assemblies requires complex inventory control due to the multiple separate components that make up the assembly. The aforementioned U.S. Pat. No. 6,854,981 (Nelson) comprises three separate components: two differently sized elastomers in addition to the short rigid pin. When the elastomer had degraded, some users prefer to replace the short rigid pin and elastomer assembly as a whole as opposed to just the degraded elastomer, further driving up the cost of testing.

Spring loaded contact pins (pogo pins) are also known to be used over a wide range of test heights including test heights of 2 mm and below. The main disadvantages associated with spring loaded contact pins include lower lifespan and lower electrical capability as compared to a single, integral metal body contact pin due to the multiple parts that are need to make up the unit as well as frequent pin tip cleaning needed due to lack of horizontal scrubbing motion of the spring loaded contact pin during testing operation.

Conducting elements dispersed within an elastomeric matrix where the dispersed elements form a conductive channel during testing operation are also known to be used for test heights of 2 mm and below. The performance of such conducting elastomeric matrix is affected by the short lifespan of the elastomeric matrix as compared to an integral metal body contact pin.

What is needed is an improved IC chip testing solution that overcomes the above problems.

SUMMARY OF INVENTION

The present invention seeks to overcome the aforementioned disadvantages by providing an electrical contact for use in an IC circuit testing apparatus with a single, integral, very short contact pin suitable for use at 2 mm test height and below and a matching new socket housing.

The electrically conductive contact pin is a single, integral cantilever style, planar contact pin designed for very short test height, preferably for test height at 2 mm or below, comprising of an upper cantilever arm and lower cantilever arm connected at a back portion and a bracket arm extending in the opposite direction from the two cantilever arms for engagement with the socket housing.

There is no need for multiple components for the present invention to operate, as compared to the short rigid pin and elastomer assemblies, pogo pins or conducting elements dispersed within an elastomeric matrix solutions as previously described. Since no elastomer is needed, the lifespan and performance of the present invention is improved over solutions that make use of short rigid pin and elastomer assemblies as well as solutions that make use of conducting elements dispersed within an elastomeric matrix.

The single, integral electrically conductive contact pin does not require the complex inventory control and replacement and assembly of the contact pin is straightforward compared to short rigid pin and elastomer assemblies solutions. The solution is also capable of withstanding extreme temperature testing that is unsuitable for contact pin solutions that includes elastomers.

Electric signal passes between the DUT and the load board through an upper contact tip at the free end of upper cantilever arm and the lower contact tip located at the lower portion of lower cantilever arm. When inserted in the socket housing, the free end of upper cantilever arm and the lower cantilever arm are arranged to be separated but maintained at a close distance from each other. At test condition, the upper cantilever arm elastically deforms towards and comes into electrical contact with the lower cantilever arm, creating an additional electrical path for electric signal to pass between the upper contact tip and lower contact tip, thereby increasing its electrical performance as compared to its uncompressed state. Such improvement in electrical performance is not present in short rigid pin and elastomer assemblies solutions as well as pogo pins.

Upper cantilever arm is arranged to elastically deform during test condition with limited horizontal displacement at its free end where a pin tip is located. Such short wiping motion has multiple benefits including longer lifespan of the contact pin, less debris generation as compared to short rigid pin and elastomer assemblies with long wiping length as the entire short rigid pin rotates about at least one axis during test condition.

The bracket arm serves a dual purpose to both mechanically engage the contact pin with the socket housing during its uncompressed state and electrically serves as a stud for impedance control of the contact pin.

DRAWINGS/BRIEF DESCRIPTION OF DRAWINGS

DETAILED DESCRIPTION OF PREFERRED EMBODIMENT

Figure 1:
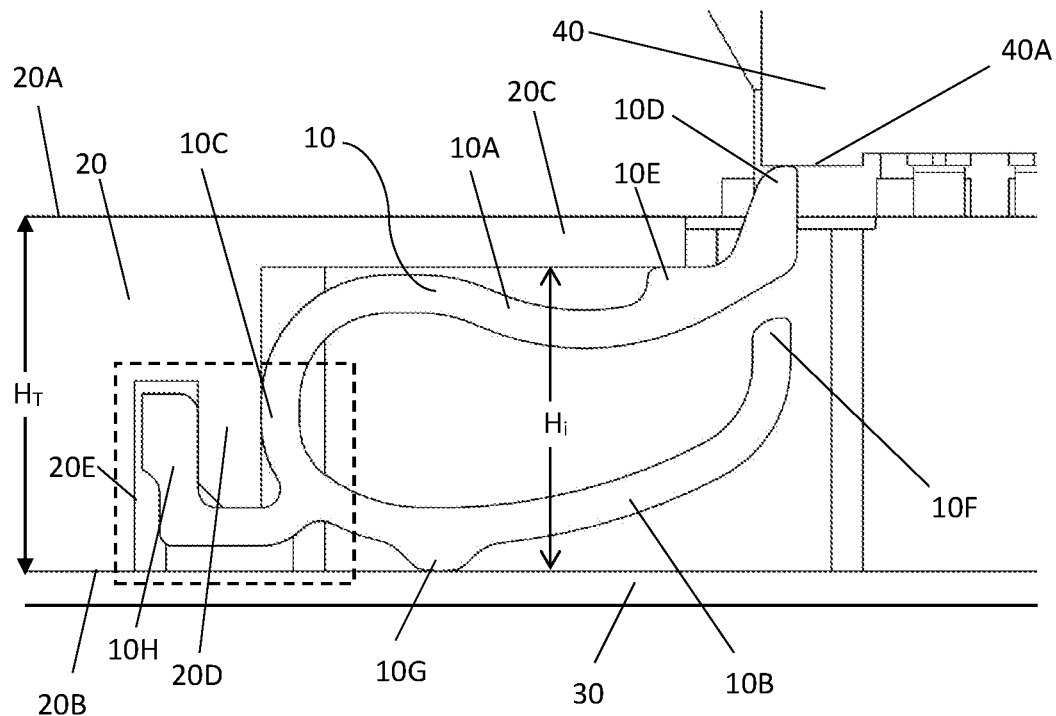
FIG. 1 show a front cross-sectional view of an electrical contact pin in an uncompressed state with an IC chip in a first embodiment of the present invention.
Figure 1A:
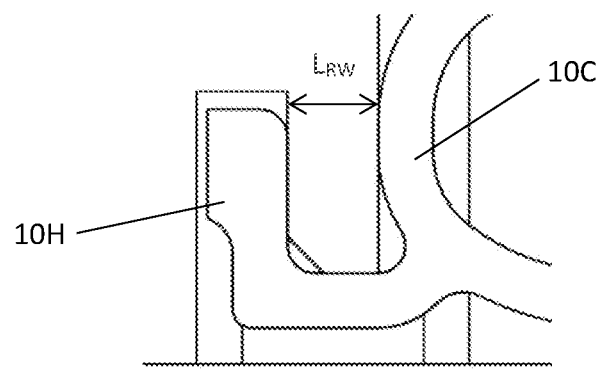
FIG. 1A is a close-up view of the selected section of FIG. 1.
Figure 2:
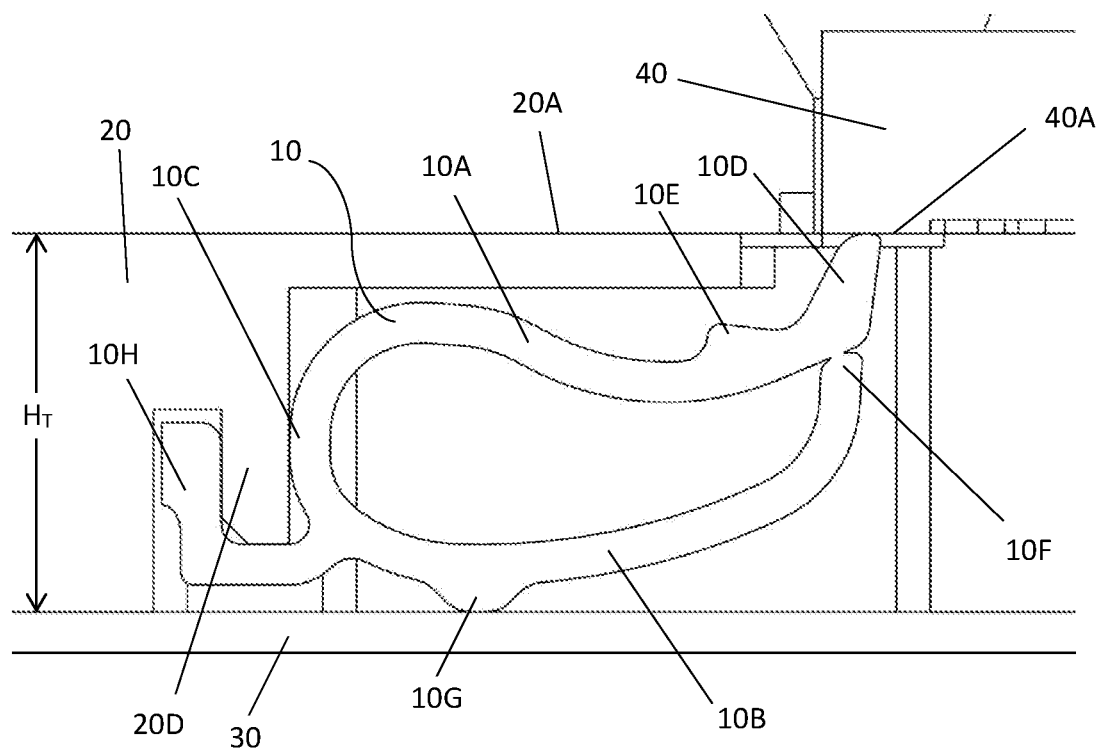
FIG. 2 shows a front cross-sectional view of an electrical contact pin in a compressed state during testing of an IC chip in a first embodiment of the present invention.

FIGS. 1 and 2 show a contact pin 10 adapted for 1.4 mm test height (Hr) mounted in a block shaped socket housing 20 having at least one pair of opposed essentially planar and parallel surface 20A and 20B and oriented essentially parallel to one another. Contact pin 10 is arranged to electrically connect to a contact pad (or lead) 40A of IC device 40 which is to be loaded in vertical motion, perpendicular to planar surface 20A to load board 30 located on planar surface 20B. In other embodiments, an interposer may be required to electrically connect load board 30 to contact pin 10.

Referring to FIG. 1, contact pin 10 comprises an upper cantilever arm 10A and a lower cantilever arm 10B connected by back portion 10C forming essentially a "C" shape. From back portion 10C, upper cantilever arm 10A extends forward, initially curving downwards following the upper arc of a typical "C" shape to an inflexion point where cantilever arm 10A continues extending forward in an upward curve. Upper cantilever arm 10A terminates at an upper pin tip 10D which is arranged to extend outwards beyond planar surface 20A toward the leads or pads of IC devices to be tested.

Upper cantilever arm 10A includes a protrusion 10E which is located between the inflexion point and upper pin tip 10D. Protrusion 10E functions to engage a roof 20C defined by an upper portion of socket housing 20 when contact pin 10 is mounted in socket housing 20. Engagement of roof 20C by protrusion 10E serves to limit the degree of upward movement of upper cantilever arm 10A and the distance that upper pin tip 10D extends beyond planar surface 20A of socket housing 20 when the contact pin 10 is mounted in the housing.

Lower cantilever arm 10B extends from the back portion 10C, below upper cantilever arm 10A in an upwards curve following the lower arc of a typical "C" and terminating at free contact end 10F at a close distance of approximately 0.1 mm below the free end of upper cantilever arm 10A. Lower cantilever arm 10B includes a lower pin tip 10G extending essentially from the lowest most point of lower cantilever arm 10B to physically contact the electrical traces on load board 30. Lower pin tip 10G is a defined, non-moving positioning of contact pin 10 with respect to load board 30 during both the uncompressed state and compressed state of contact pin 10.

Figure 3:
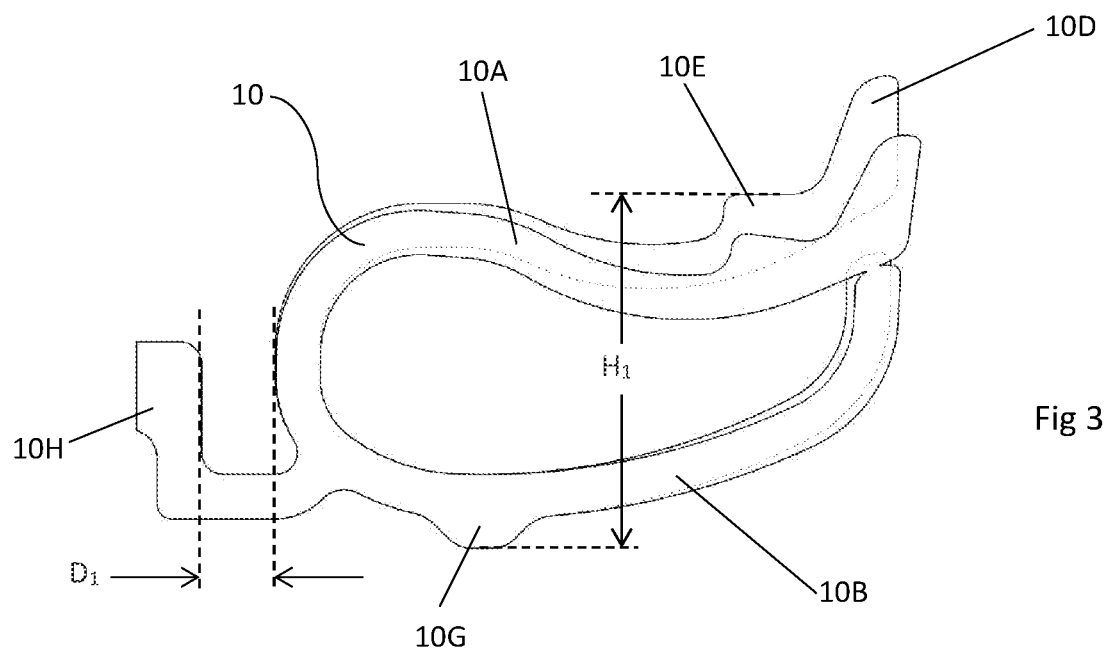
FIG. 3 shows a front cross-sectional view of an electrical contact pin between a partially compressed state (mounted in socket housing) and a fully compressed state (test condition) in a first embodiment of the present invention.

FIG. 3 is a representation of the contact pin mounted in a housing superimposed on the same contact pin at test condition. When contact pin 10 is not mounted in socket housing 20 (free state), the vertical distance between protrusion 10E and lower pin tip 10G, Hi is slightly greater than the distance between the inner surface of roof 20C and planar surface 20B (Hi) such that when mounted in socket housing 20, upper cantilever arm 10A is lightly biased against roof 20C at the contact point formed between roof 20C and protrusion 10E. For the present embodiment, $H_l$ is 1.22 mm when contact pin is in its free state and H$i$ is 1.2 mm. In its free state, the closest distance between the free end of lower cantilever arm 10B and the free end of upper cantilever arm is in the range of 0.14 mm to 0.16 mm and is approximately 0.15 mm for the present embodiment. When mounted in socket housing 20, the closest distance between the free end of lower cantilever arm 10B and the free end of upper cantilever arm is in the range of 0.115 mm to 0.135 mm.

A retaining wall 20D planar to and horizontally displaced from inner socket wall 20B of socket housing 20 extends perpendicularly downwards from roof 20C and terminates a short distance before planar surface 20B. Extending from a lower part of back portion 10C away from upper and lower cantilever arms 10A and 10B, a "L" shaped bracket arm 10H together with back portion 10C defines a channel for receiving retaining wall 20D.

Figure 2A:
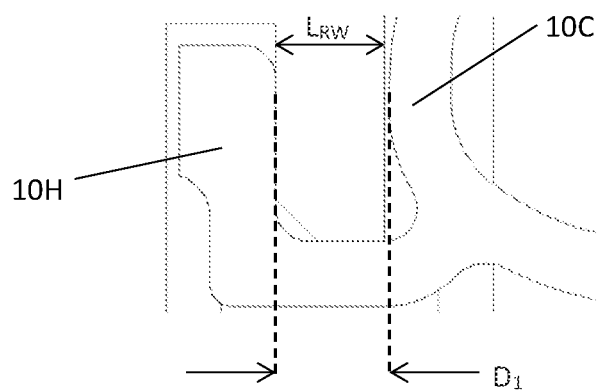
FIG. 2A is a close-up view of the selected section of FIG. 2, showing disengagement of the back portion of the electrical contact pin from the socket housing.

$D_1$ most clearly seen in FIG. 2A, is the closest distance between the vertical part of bracket arm 10H and back portion 10C of contact pin 10. When contact pin 10 is in its free state, i.e. contact pin is not inserted in housing socket 20 and no external forces are exerted on contact pin 10, $D_1$ is slightly less than the thickness of retaining wall 20D (Law) such that retaining wall 20D is lightly gripped by contact pin 10 when contact pin 10 is mounted in socket housing 20. For the present embodiment, $D_1$ when the pin is in its free state is 0.24 mm and $L_{RW}$ is 0.25 mm. Bracket arm 10H additionally serves as a stud for impedance control to the contact pin.

Electrically conductive contact pin 10 is fabricated using wire cut EDM (Electrical Discharge Machining) from a beryllium copper alloy (BeCu) metal sheet of constant 0.2 mm thickness and having essentially identical opposing lateral faces. Depending on the requirements, contact pin 10 may be fabricated using BeCu metal sheet of thickness in the range of 6 mil to 20 mil (0.15 mm-0.5 mm). The thin wire used to discharge the electrified current allows for precision cuts, with a positioning accuracy down to +/−0.01 mm. BeCu alloy is susceptible to oxidization when exposed to air and humidity. A plating process is utilised to seal the outer surface of contact pin 10 in order to eliminate or reduce its oxidization rate. Typically, the outer coating used is gold (Au) and bonding between BeCu and Au is achieved using nickel (Ni) interface. Thus, the base material up to surface layer of contact pin 10 is BeCu—Ni—Au. Other coating compositions are possible and contact pin 10 may be fabricated with any plating at all. Fabrication using wire cut EDM produces contact pins 10 with an essentially consistent cross section which leads to reduction of any potential bounced signal and better mechanical stability when in assembly. Other methods of fabrication such as electroforming produces contact pins of less consistent cross sections when the thickness value increases.

It is to be understood that various types of IC devices including analog IC devices, high frequency IC devices and mixed-signal IC devices can be tested utilising a test socket 20 and contact pin 10 as illustrated by the present embodiment.

Referring to FIG. 2, fully depressed under test condition, upper cantilever arm 10A is elastically deformed downwardly clockwise such that the free end of upper cantilever arm 10A presses down on free contact end 10F. Free contact end 10F corresponding elastically deforms downwardly clockwise such that a reliable contact point is formed between the free ends of upper and lower cantilever arm 10A and 10B. A parallel circuit whereby electrical signal passes between IC device 40 and load board 30 via upper pin tip 10D through both cantilever arms 10A and 10B and lower pin tip 10G Parallel circuit leads to a reduction of resistance (R); reduction of impedance (L); increase in capacitance (C). The resultant of all 3 variables above is known as impedance ($Z_0$). As the contribution of C is less significant in comparison to R & L, the impedance ($Z_0$) of contact pin 10 at test condition is lower compared to its uncompressed state. The dimensions of contact pin 10 are designed such that elastic deformation of contact pin 10 under test condition results in back portion 10C disengaging from retaining wall 20D of socket housing 20. D; increases as contact pin 10 elastically deforms and eventually becomes greater than $L_{RW}$, thus optimizing housing lifespan. For the present embodiment, $D_1$ at test condition is 0.253 mm. In addition, there is minimal issue with load board digging as lower contact tip 10G is stationary with respect to load board 30.

FIG. 3 illustrates the elastic deforming of upper cantilever arm 10A when contact pin 10 is between a mounted pre-test state and mounted compressed (test) state. The scrubbing/ wiping length achieved during elastic deforming of arm 10A of the present embodiment is less than 0.10 mm, preferably in the range of 0.06 to 0.07 mm. Short wiping length has many advantages including less debris generation, less wearing on the pin tip 10D thus resulting in a longer pin tip lifespan, is more accommodating for device offset, for example in the case of worn out alignment plate of the IC device, and allows for testing of IC devices with very short device pad. With less debris and longer pin tip lifespan, the frequency of downtime for cleaning and pin replacement is reduced.

Figure 4:
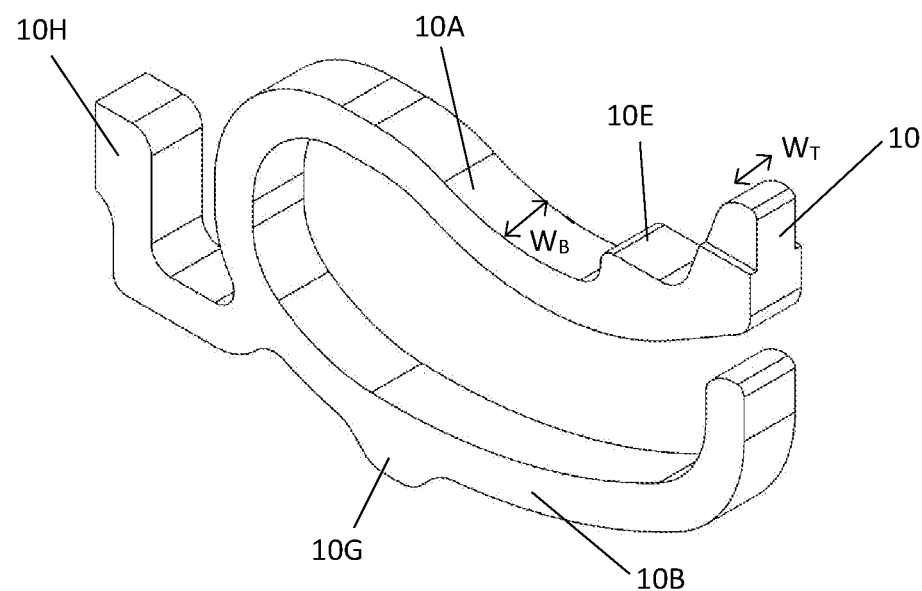
FIG. 4 is a perspective view of an electrical contact pin of a second embodiment of the present invention.

FIG. 4 illustrates a contact pin 10 of a second embodiment of the present invention. Whilst the width of the contact pin 10 in FIG. 1 is constant across its entire body, step cuts are made at the contact end of upper pin tip 10D such that it is narrower than the thickness of the main body of contact pin 10 ($W_B > W_T$). $W_B$ is envisaged to be in the range of 0.20 mm to 0.50 mm and $W_T$ may be in the range of 0.15 m to 0.40 mm. For the present embodiment, $W_B$ is 0.20 mm and $W_T$ is 0.15 mm. This arrangement caters to high current testing of IC devices with small contact pads as well as IC devices with small contact pads in general.

Figure 5A:
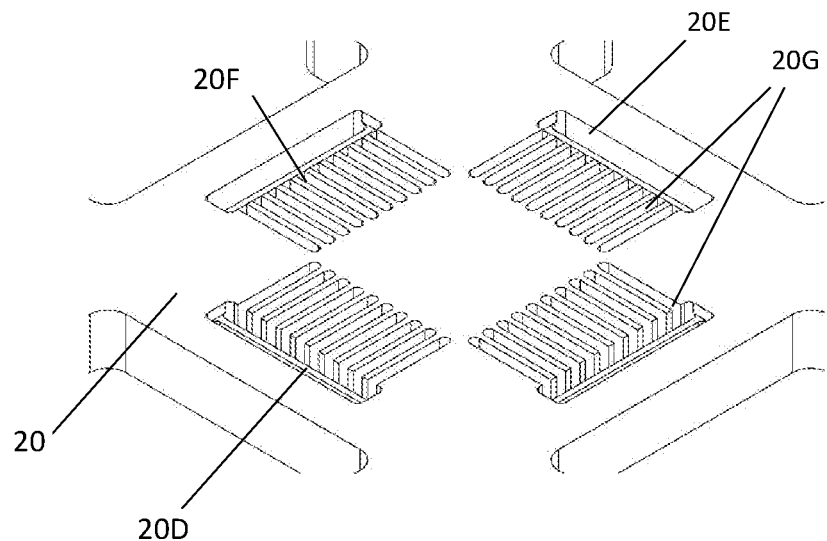
FIG. 5A shows an upside-down perspective view of a socket housing in a first embodiment of the present invention.
Figure 5B:
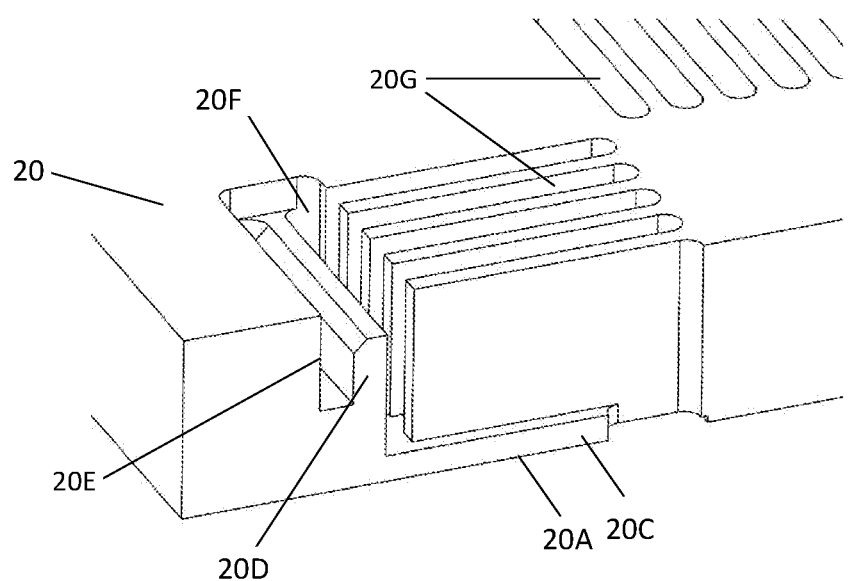
FIG. 5B shows a close up upside-down perspective cross-sectional view of a socket housing in a first embodiment of the present invention.

FIG. 5A shows an upside-down perspective view of a socket housing 20 in an embodiment of the present invention. The socket housing 20 has a square configuration, with four socket cavities 20F cut out near and aligned with each side of socket housing 20. Socket cavity 20F is cut out from a bottom side of socket housing 20 and extends out from planar surface 20A in a series of exit slots (not shown in FIG. 5A but partially shown in FIG. 5B). At each socket cavity 20F, there is provided further a plurality of socket slots 20G that run perpendicular to the length of socket cavity 20F. Retaining wall 20D extends across the full length of socket cavity 20F. Inner socket wall 20E can be seen at outer ends of each socket slot 20F. FIG. 5B is a close-up upside-down perspective cross-sectional view of the socket housing of FIG. 5A showing inner socket wall 20E, retaining wall 20D) and roof 20C. The invention encompasses socket housings of various configurations, such as socket housings with only two socket cavities 20F located on opposing sides of the socket housing. In other embodiments, the socket cavity 20F may only comprise a single slot 20G and such slot is adapted to receive one or more contact pins 10.

Figure 6A:
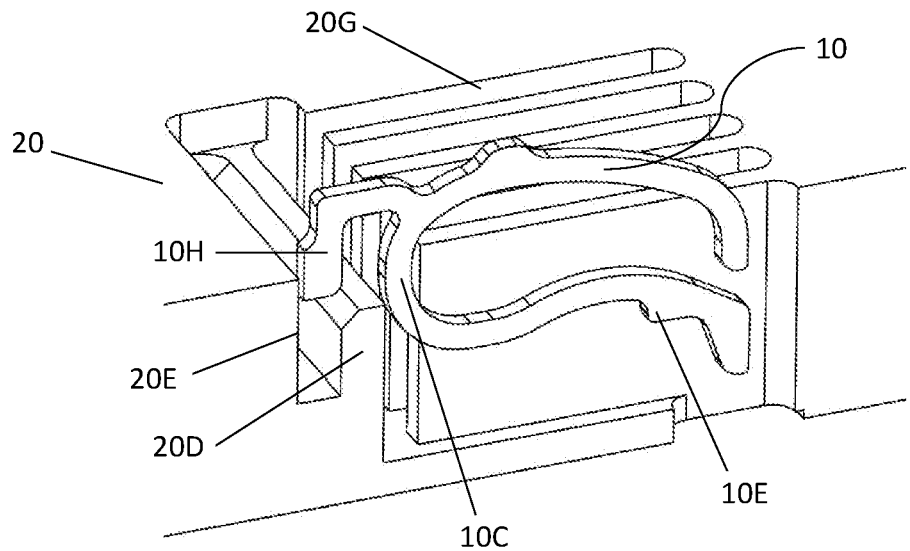
FIG. 6A shows an upside-down perspective cross-sectional view of the insertion of an electrical contact pin into a receiving slot of a socket housing according to a first embodiment of the present invention.

FIG. 6A shows the insertion of one contact pin 10 into a socket slot 20G. Contact pin 10 is first aligned with the opening of a socket slot 20G, upside down with bracket arm 10H positioned on the outer end of the socket slot. As contact pin 10 is inserted vertically into the slot 20G, bracket arm 10H is guided into the space between inner socket wall 20E and retaining wall 20D. The open end of retaining wall 20D is chamfered to improve the case of insertion of bracket arm 10H. As described $D_1$, the closest distance between the vertical part of bracket arm 10H and back portion 10C of contact pin 10 at its free state is adapted to be slightly less than the thickness of retaining wall, $L_{RW}$. The difference between $L_{RW}$ and $D_1$ may be approximately in the range of 0.01 mm to 0.02 mm. The user simply applies a light force to push contact pin 10 into a fully inserted position.

Figure 6B:
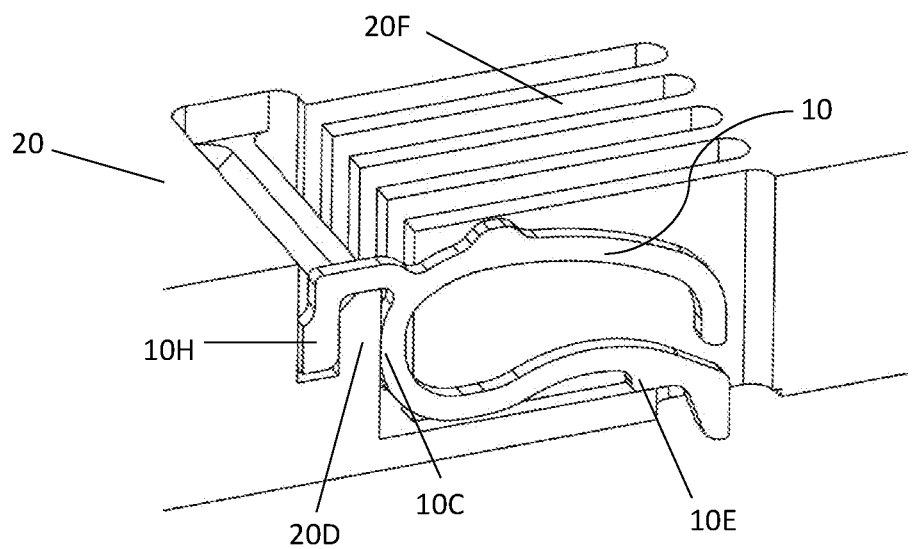
FIG. 6B shows an upside-down perspective cross-sectional view of an electrical contact pin fully loaded into a receiving slot of a socket housing according to an embodiment of the present invention

Contact pin 10 is shown fully inserted into a socket slot 20G in FIG. 6B. Bracket arm 10H and back portion 10C resiliently grips retaining wall 20D hence preventing accidental pin drop. Protrusion 10E of upper cantilever arm 10B is also in light resilient engagement with roof 20C.

While a preferred embodiments of the present invention have been described and illustrated, it should be apparent to those skilled in the art that various changes and modifications can be made without departing from the spirit and scope of the invention. Accordingly, the following claims are intended to embrace such changes, modifications, and areas of application that are within the scope of this invention.

LIST OF NUMBERED ELEMENTS IN FIGURES

Contact Pin 10
Socket housing 20
Planar surface 20A, 20B
Upper cantilever arm 10A
Lower cantilever am 10B
Back portion 10C
Upper pin tip 10D
Protrusion 10E
Roof 20C
Free contact end 10F
Lower pin tip 10G
Load board 30
Retaining wall 20D
Inner socket wall 20E
Bracket arm 10H
Socket cavity 20F
Slot 20G
IC device 40
Device pad (or lead) 40A

The invention claimed is:

1. An integral electrical contact pin for electrically connecting a test terminal of a tester load board with an integrated circuit (IC) terminal of an IC device, the integral electrical contact pin comprising:
a resilient upper cantilever arm having a free end and an opposing connecting end;
an upper pin tip located at the free end of the upper cantilever arm for contacting the IC terminal of the IC device;
a lower cantilever arm having a free end and an opposing connecting end, the lower cantilever arm extending essentially in a same horizontal direction relative to the upper cantilever arm, arranged below and spaced apart from the upper cantilever arm;
a lower pin tip extending downwardly from a bottom major surface of the lower cantilever arm for contacting the test terminal of the tester load board; and
a back portion commonly connecting the opposing connecting end of the upper cantilever arm to the opposing connecting end of the lower cantilever arm; wherein
the free end of the upper cantilever arm is movable between a default first position where the free end of the upper cantilever arm and the free end of the lower cantilever arm are spaced apart and a second position where a lower surface of the free end of the upper cantilever arm moves in a vertical direction to be in contact with an upper surface of the free end of the lower cantilever arm, and
wherein in the second position, the free ends of the upper and lower cantilever arms form an electrical contact such that parallel conduction paths are formed between the upper pin tip and the lower pin tip through both the upper and lower cantilevers.

2. The integral electrical contact pin of claim 1, wherein the free end of the upper cantilever arm is elastically biased from the default first position to the second position in response to an extenlal load applied onto the upper pin tip.

3. The integral electrical contact pin of claim 2, wherein the upper cantilever arm, the lower cantilever arm, and the back portion form essentially a "C" shape.

4. The integral electrical contact pin of claim 2, wherein the integral electrical contact pin is adapted for a test height at 2 mm and below.

5. The integral electrical contact pin of claim 2, wherein the upper pin tip is narrower than a thickness of a main body of the integral electrical contact pin.

6. The integral electrical contact pin of claim 1, wherein a closest distance between the free end of the upper cantilever arm at the default first position and the free end of the lower cantilever arm is between 0.14 mm to 0.16 mm.

7. A test socket assembly, comprising:
a socket housing having a lower surface generally in engagement with a surface of a tester load board, said socket housing further having an upper surface, generally parallel to, spaced from, and facing oppositely from said lower surface, at least one socket cavity formed in said socket housing extending through said socket housing between said lower surface and said upper surface, the at least one socket cavity having at least one socket slot and the at least one socket cavity having a roof section on the upper surface; and
at least one integral electrical contact pin according to claim 1 mounted within the at least one socket slot, the integral electrical contact pin further comprising a protrusion located on the free end of the upper cantilever arm, wherein
when the integral electrical contact pin is mounted within the at least one socket slot, the free end of the upper cantilever arm is in a third position, in between the default first position and the second position due to the protrusion on the upper cantilever arm engaging with the roof section of the at least one socket slot.

8. The test socket assembly of claim 7, wherein a closest distance between the free end of the upper cantilever arm at its third position and the lower cantilever arm is between 0.115 mm to 0.135 mm.

9. The test socket assembly of claim 7, wherein the at least one socket cavity further comprises a retaining wall planar to and horizontally displaced from a side wall of the at least one socket cavity transverse to the at least one socket slot, the retaining wall extending from the upper surface of the socket housing into the at least one socket cavity and terminating a distance before the lower surface of the socket housing and the integral electrical contact pin further comprises a bracket arm, the bracket arm extending in an opposite direction from the upper and lower cantilever arms, the bracket arm and the back portion defining a channel to receive the retaining wall of the at least one socket cavity when the integral electrical contact pin is mounted within the at least one socket slot.

10. The test socket assembly of claim 9, wherein the bracket arm is a "L" shape extension from the back portion of the integral electrical contact pin.

11. The test socket assembly of claim 9, wherein a width of the retaining wall is greater than a width of the channel defined by the bracket arm and the back portion of the integral electrical contact pin such that the retaining wall is gripped by the integral electrical contact pin when said integral electrical contact pin is mounted in the socket housing.

12. The test socket assembly of claim 11, wherein a difference between the width of the retaining wall and the width of the channel defined by the bracket arm and the back portion of the integral electrical contact pin is between 0.01 mm to 0.02 mm.

13. The test socket assembly of claim 12, wherein during test conditions, the resilient upper cantilever arm is biased to the second position and the back portion of the integral electrical contact pin disengages from the retaining wall.

14. The test socket assembly of claim 9, wherein the upper pin tip of the integral electrical contact pin has a wiping length of less than 0.10 mm.

15. The test socket assembly of claim 9, wherein the upper pin tip of the integral electrical contact pin has a wiping length between 0.06 mm to 0.07 mm.

* * * * *